(12) United States Patent
Gao et al.

(10) Patent No.: US 6,410,461 B1
(45) Date of Patent: Jun. 25, 2002

(54) METHOD OF DEPOSITING SION WITH REDUCED DEFECTS

(75) Inventors: Pei-Yuan Gao, San Jose; Minh Van Ngo, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/849,357

(22) Filed: May 7, 2001

(51) Int. Cl.[7] .............................................. H01L 21/469
(52) U.S. Cl. ........................ 438/786; 438/636; 438/792; 438/637; 438/952; 438/676
(58) Field of Search .................... 438/786, 952, 438/671, 676, 636, 792, 624, 788, 637, 626, 631, 633, 634

(56) References Cited

U.S. PATENT DOCUMENTS

| | | | | |
|---|---|---|---|---|
| 4,543,707 A | * | 10/1985 | Ito et al. ..................... | 29/578 |
| 5,880,018 A | * | 3/1999 | Boeck et al. ................ | 438/619 |
| 6,060,132 A | * | 5/2000 | Lee .............................. | 427/579 |
| 6,153,541 A | * | 11/2000 | Yao et al. .................... | 438/786 |
| 6,221,794 B1 | * | 4/2001 | Pangrle et al. .............. | 438/792 |
| 6,294,460 B1 | * | 9/2001 | Subramanian et al. ...... | 438/636 |
| 2001/0044220 A1 | * | 11/2001 | Sun et al. .................... | 438/786 |

* cited by examiner

Primary Examiner—Michael Trinh
Assistant Examiner—Khanh B. Duong

(57) ABSTRACT

Silicon oxynitride layers are deposited by plasma enhanced chemical vapor deposition with significantly reduced defects, such as nodules, employing a ramp down step at the end of the deposition cycle. Embodiments include depositing a SION ARC at a first power, discontinuing the flow of $SiH_4$ and ramping down to a second power while continuing the flow of $N_2O$ and $N_2$, and ramping down to a third power while continuing the flow of $N_{2O}$ and $N_2$ before pumping down. The resulting relatively defect free silicon oxynitride layers can be advantageously employed as an ARC, particularly when patterning contact holes in manufacturing flash memory devices.

10 Claims, 1 Drawing Sheet

METHOD OF DEPOSITING SION WITH REDUCED DEFECTS

FIELD OF THE INVENTION

The present invention relates to a method of manufacturing semiconductor devices having high reliability. The present invention has particular applicability in manufacturing high density, multi-level flash-memory semiconductor devices with feature dimensions in the deep sub-micron regime.

BACKGROUND ART

As integrated circuit geometries continue to plunge into the deep sub-micron regime the requirements for dimensional accuracy become increasingly difficult to satisfy. Integration technology is considered one of the most demanding aspects of fabricating ULSI devices. Demands for ULSI semiconductor wiring require increasingly denser arrays with minimal spacings between narrower conductive lines. Implementation becomes problematic in manufacturing flash memory semiconductor devices having a design rule about 0.18 micron and under.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, conductive patterns on different levels, i.e., upper and lower levels, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as feature sizes shrink into the deep sub-micron regime.

A conductive plug filling a via hole is typically formed by depositing an interlayer dielectric (ILD) on a conductive level comprising at least one conductive feature, forming an opening through the ILD by conventional photolithographic and etching techniques, and filling the opening with a conductive material. Excess conductive material or the overburden on the surface of the ILD is typically removed by chemical-mechanical polishing (CMP). One such method is known as damascene and basically involves forming an opening in the ILD and filling the opening with a metal. Dual damascene techniques involve forming an opening comprising a lower contact hole or via hole section in communication with an upper trench section, which opening is filled with a conductive material, typically a metal, to simultaneously form a conductive plug in electrical contact with an upper conductive line.

As device geometries proceed into the deep submicron regime, the formation of reliable contacts and vias becomes particularly problematic. For example, as the contact and via openings are reduced in diameter and aspect ratios increased, the openings become more vulnerable to defects, such as particulate contamination which clog the openings preventing complete filling and, hence, adversely impacting interconnect reliability.

Accordingly, there exists a need for methodology enabling the manufacture of semiconductor devices with improved reliability, including semiconductor devices containing typical MOS transistors as well as flash memory devices, such as electrically erasable programmable read only memory (EEPROM) devices. There exists a particular need for methodology enabling the manufacture of semiconductor devices having features in the deep sub-micron range and containing reliable vias and contacts.

DISCLOSURE OF THE INVENTION

An advantage of the present invention is a method of manufacturing a semiconductor device exhibiting improved reliability.

Another advantage of the present invention is a method of manufacturing a semiconductor device having features in the deep sub-micron regime with highly reliable vias and contacts.

A further advantage of the present invention is a method of manufacturing flash memory semiconductor devices having features in the deep sub-micron regime with highly reliable vias and contacts.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising depositing a layer of silicon oxynitride, over a substrate, by the following sequential steps: (a): flowing silane ($SiH_4$), nitrous oxide ($N_2O$) and nitrogen ($N_2$); (b): initiating deposition of silicon oxynitride at a first power while flowing $SiH_4$, $N_2O$ and N2; (c): ramping down by reducing the power, discontinuing the flow of $SiH_4$ and continuing the flow of $N_2O$ and $N_2$; and (d): discontinuing the power and flow of $N_2O$ and $N_2$.

Embodiments of the present invention include conducting the step (c) into stages: ($c_1$) ramping down by reducing the first power to a second power, discontinuing the flow of $SiH_4$ and continuing the flow of $N_2O$ and $N_2$; and ($c_2$) continuing ramping down by reducing the second power to a third power and continuing the flow of $N_2O$ and $N_2$. Further embodiments of the present invention including depositing the silicon oxynitride at a first RF power of about 290 to about 360 watts; ramping down to a second RF power of about 170 to about 210 watts and continuing to ramp down to a third RF power of about 80 watts to about 100 watts before pumping down. Further embodiments of the present invention comprise depositing the silicon oxynitride layer as an anti-reflective coating (ARC) at a thickness of about 260Å to about 340Å, overlying a flash memory cell, and forming a contact hole through the silicon oxynitride ARC to a source/drain region of the flash memory cell.

Additional advantages of the present invention will become readily apparent to those skilled in the art from the following detailed description wherein embodiments of the present invention are described simply by way of illustrated of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
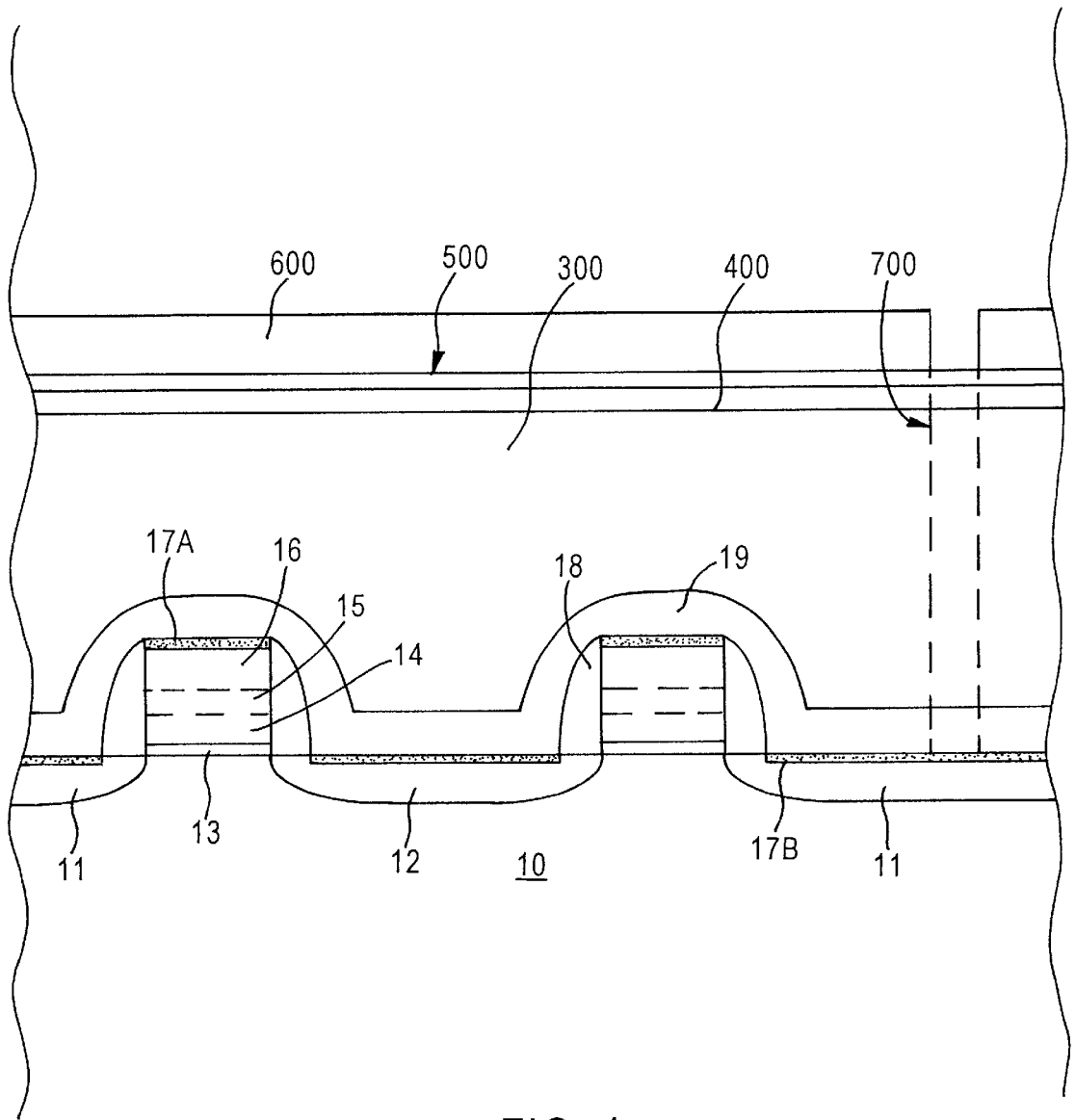
FIG. 1 schematically illustrates an embodiment of the present invention.

The present invention addresses and solves reliability problems by providing efficient methodology enabling the formation of contacts and vias with greater reliability particularly in fabricating semiconductor devices having design features in the deep sub-micron regime. Embodiments of the present invention are particularly applicable in fabricating flash memory devices with improved contacts, particularly contacts having a diameter of about 0.20 to about 0.24 micron.

Upon investigating failures of various EEPROM devices, it was found that the silicon oxynitride ARC deposited on the $ILD_0$ (first interlayer dielectric) exhibited an extremely high defect count, e.g., greater than 5,000 defects per square centimeter. Such defects, in the nature of particulate contamination, such as nodules, were found, upon analysis, to be silicon (Si)-rich nodules. Such nodules exhibited a particular size of primarily less than 0.20 micron and were found to obstruct contact holes preventing complete filling thereof and, thereby, adversely impacting interconnect reliability and the yield of flash memory products.

Having uncovered the particular problem efforts were undertaken to uncover the source of the problem of Si-rich nodule formation. Upon investigation, it was hypothesized that such Si-rich nodules are generated at the end point, e.g., final few seconds, of silicon oxynitride deposition during which it is believed that silicon oxynitride is not actually formed. Accordingly, experiments were conducted on techniques to reduce the formation of Si-rich nodules during PECVD of silicon oxynitride.

Upon further experimentation and investigation, it was found that the formation of Si-rich nodules during PECVD of silicon oxynitride can be eliminated or substantially reduced by strategically ramping down the power at the end of deposition, as in a plurality of stages, discontinuing the flow of $SiH_4$ but continuing the flow of $N_2O$ and $N_2$. The precise mechanism underlying the elimination or substantial reduction in the formation of Si-rich nodules during PECVD of silicon oxynitride by implementing the present invention is not known with certainty. However, it is believed that by slowly ramping down the power, discontinuing the flow of $SiH_4$ and continuing the flow of $N_2$ and $N_2O$, any silicon nodules which may have formed are converted into silicon oxynitride.

Accordingly, embodiments of the present invention comprise flowing $SiH_4$, $N_2O$ and $N_2$ into a deposition chamber, elevating the pressure and initiating a plasma to commence deposition of a silicon oxynitride ARC. At the end of deposition, a strategic ramping down is conducted by discontinuing the flow of $SiH_4$, reducing the power and continuing the flow of $N_2O$ and $N_2$ for a short period of time prior to pump down, i.e., discontinuing the flow of $N_2O$ and $N_2$ and shutting off the power. Embodiments of the present invention comprise ramping down in two stages from a first power to a lower second power and then from the second power to a lower third power, prior to pumping down.

In implementing embodiments of the present invention, it was found suitable to introduce the reactive gases into a deposition chamber at a $SiH_4$ flow rate of about 109 to about 135 sccm, e.g., about 122 sccm, a $N_2O$ flow rate of about 37 to about 47 sccm, e.g., about 42 sccm, and a $N_2$ flow rate of about 500 to about 610 sccm, e.g., about 550 sccm. The pressure is then elevated to about 3 to about 5 Torr and the temperature elevated to about 360° to about 420°. A plasma is then initiated at a first RF power of about 290 to about 360 watts, e.g., about 325 watts. Deposition of the silicon oxynitride ARC is then conducted as, for about 1 to about 20 seconds, to deposit a layer having a thickness of about 260Å to about 340Å. Ramping down is then initiated by discontinuing the flow of $SiH_4$, reducing the first RF power to a second RF power of about 170 to about 210 watts, e.g., about 190 watts, while continuing the flow of $N_2O$ and $N_2$, for a short period of time, such as about 1.5 to about 3.5 seconds, e.g., about 2 seconds. Ramping down is then continued in a second ramping down stage by reducing the second RF power to a third RF power of about 80 to about 100 watts, e.g., about 90 watts, for a short period of time, such about 1.5 to about 3.5 seconds, e.g., about 2 seconds. Pump down is then implemented by discontinuing the flow of $N_2O$ and $N_2$ and shutting the power and reducing the pressure.

Embodiments of the present invention comprising strategically ramping down the power without the flow of $SiH_4$ but continuing the flow of $N_2O$ and $N_2$ at the end of silicon oxynitride ARC deposition result in a significantly reduced defect count, e.g., less than about 30 per square centimeter square vis-a-vis 5,000 per square centimeter resulting from prior techniques. The present invention is particularly applicable in forming contact holes in flash memory devices and filling the contact holes with a metal to form contacts.

An embodiment of the present invention is schematically illustrated in FIG. 1, wherein transistors are shown formed on substrate 10. The transistors can comprise MOS transistors and/or dual gate memory cell transistors comprising floating and control gates with an interpoly (ONO) dielectric therebetween. For example, the transistors can comprise tunnel oxide 13, a floating gate electrode 14, an ONO stack interpoly dielectric 15, and a control gate 16. A layer of metal silicide 17A is formed on an upper surface of the gate electrode stack while a layer of metal silicide 17B is formed on the source/drain regions 11, 12. A dielectric sidewall spacer 18 is formed on the side surfaces of the gate electrode and a silicon nitride etch stop layer 19 deposited thereon. A first dielectric layer 300, such as boron and phosphorus doped silicate glass (BPSG), is deposited, as the thickness of about 7,500 Å to about 8,5000 Å, e.g., about 8,000 Å, and a second dielectric layer 400, such undoped silicon oxide derived from tetraethyl orthosilicate (TEOS), is deposited, as at a thickness of about 900 Å to about 1,100 Å, e.g., about 1,000 Å, and planarized. A silicon oxynitride ARC 500, as at a thickness of about 260 Å to about 340 Å, e.g., about 300 Å, is then deposited in accordance with the present invention, employing a strategic power ramp down technique in the absence of $SiH_4$ but continuing the flow of $N_2O$ and $N_2$, to form a substantially defect free ARC without any appreciable Si-rich nodules. A photoresist mask 600 is then formed, and anisotropic etching is conducted to form contact opening 700 exposing impurity region 11. The contact hole is then filled in a conventional manner, as with a conductive material, such as a metal, to form a highly reliable contact.

The formation of silicon oxynitride ARC 500 with no or significantly reduced Si-rich nodules enables complete filling contact hole 700 with significantly improved reliability and increased yield by eliminating a significant source of rejection, i.e., clogging of the contact holes by Si-rich nodules. Accordingly, the present invention provides methodology enabling the manufacture of semiconductor devices having sub-micron openings with significantly improved reliability and significantly improved yield.

EXAMPLE

Silicon oxynitride ARCs were deposited under essentially the same conditions except for implementing the pump down technique in accordance with embodiments of the present invention. A first silicon oxynitride ARC was deposited at a $SiH_4$ flow rate of 122 sccm, a $N_2O$ flow rate of 42 sccm, a $N_2$ flow rate of 550 sccm and an RF power of 325 watts. After deposition of the silicon oxynitride ARC, pump down was implemented by discontinuing the flow of $SiH_4$, $N_2O$ and $N_2$ and reducing the power. The defect count was found to exceed 5,000 nodules per square centimeter, the nodules having a particle size up to 0.20 micron. In order to reduce the particle count it was found necessary to employ a scrubber which adversely impacts manufacturing throughput and generates additional surface issues.

A second silicon oxynitride ARC was deposited under essentially the same conditions, e.g., a $SiH_4$ flow rate of 122 sccm, a $N_2O$ flow rate of 42 sccm, a $N_2$ flow rate of 550 sccm and an RF power of 325 watts. However, subsequent to deposition of the second silicon oxynitride ARC, a first ramp down stage was conducted for about two seconds during which the $SiH_4$ flow was discontinued, the $N_2O$ and $N_2$ flow rate continued, and the power reduced to 190 watts. A second ramp down stage was then conducted for two seconds during which the $N_2O$ and $N_2$ flow was continued but power reduced to 90 watts. Pump down was then implemented by discontinuing the flow of N2O and N2 and discontinuing power. An examination revealed that the particle count of the second silicon oxynitride ARC was less than 30 modules per square centimeter. These results demonstrated that the implementation of a ramping down stage between deposition and pump down in accordance with an embodiment of the present invention dramatically reduces the defect (nodule) count and, hence, dramatically improves manufacturing throughput and yield while increasing device reliability.

The present invention enjoys industrial applicability in manufacturing any of various types of semiconductor devices with improved reliability. The present invention has particular applicability in manufacturing semiconductor devices with design features in the deep sub-micron regime, such as flash memory devices, e.g., EPROMs, with a design rule of about 0.18 micron and under, with significantly improved reliability and improved manufacturing throughput.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising depositing a layer of silicon oxynitride, over a substrate by:

(a): flowing silane ($SiH_4$), nitrous oxide ($N_2O$) and nitrogen ($N_2$);

(b): initiating deposition of silicon oxynitride at a first power while flowing $SiH_4$, $N_2O$ and $N_2$;

(c): ramping down by reducing the first power to a second power, discontinuing the flow of $SiH_4$, and continuing the flow of $N_2O$ and $N_2$; and (d): discontinuing the power and flow of $N_2O$ and $N_2$.

2. The method according to claim 1, comprising conducting step (c) in two stages by:

($c_1$): ramping down by reducing the first power to a second power, discontinuing the flow of $SiH_4$ and continuing the flow of $N_2O$ and $N_2$; and ($c_2$): continuing ramping down by reducing the second power to a third power, and continuing the flow of $N_2O$ and $N_2$.

3. The method according to claim 2, comprising:

conducting step (b) at:
   a $SiH_4$ flow rate of about 109 to about 135 sccm;
   an $N_2O$ flow rate of about 37 to about 47 sccm;
   an $N_2$ flow rate of about 500 to 610 sccm;
   a first RF power of about 290 to about 360 watts;
   a pressure of about 3 to about 5 Torr; and
   a temperature of about 360° C. to about 420° C.;

conducting stage ($c_1$) at:
   a second RF power of about 170 to about 210 watts while maintaining the $N_2O$ and $N_2$ flow rates, pressure and temperature of step (b); and conducting stage ($c_2$) at:
   a third RF power of about 80 to about 100 watts while maintaining the $N_2O$ and $N_2$ flow rates, pressure and temperature of step (b).

4. The method according to claim 3, comprising:

conducting stage ($c_1$) for about 1.5 to about 3.5 seconds at the second RF power of about 170 to about 210 watts; and conducting stage ($c_2$) for about 1.5 to about 3.5 seconds at the third RF power of about 80 to about 100 watts.

5. The method according to claim 1, comprising introducing $SiH_4$, $N_2O$ and $N_2$ into a deposition chamber at the flow rates used in step (b) and raising the pressure to about 3 to about 5 Torr before initiating step (b).

6. The method according to claim 1, comprising depositing the SION layer on a dielectric layer.

7. The method according to claim 6, comprising depositing the SION layer at a thickness of about 260 Å to about 340 Å, wherein the SION layer functions as an antireflective coating (ARC).

8. The method according to claim 6, comprising:
   forming a non-volatile memory device, containing source/drain regions, on a semiconductor substrate;
   depositing a first dielectric layer over the device;
   depositing a second dielectric layer on the first dielectric layer;
   depositing the SION layer on the second dielectric layer;
   forming a photoresist mask on the SION layer, wherein the SION layer functions as an ARC; and
   etching a contact hole through the SION layer and the first and second dielectric layers to one of the source/drain regions.

9. The method according to claim 8, wherein:
   the first dielectric layer comprises a boron- phosphorus-doped silicate glass (BPSG); and
   the second dielectric layer comprises undoped silicon oxide derived from tetraethyl orthosilicate (TEOS).

10. The method according to claim 9, comprising:
    depositing the BPSG at a thickness of about 7,500 Å to about 8,500 Å; and
    depositing the undoped silicon oxide layer at a thickness of about 900 Å to about 1,100 Å.

* * * * *